US012674244B2

(12) United States Patent
Xu et al.

(10) Patent No.: US 12,674,244 B2
(45) Date of Patent: Jul. 7, 2026

(54) LOW TEMPERATURE HYBRID BONDING METALLIZATION

(71) Applicant: APPLIED Materials, Inc., Santa Clara, CA (US)

(72) Inventors: Jing Xu, Kalispell, MT (US); John Klocke, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 579 days.

(21) Appl. No.: 18/160,912

(22) Filed: Jan. 27, 2023

(65) Prior Publication Data

US 2024/0254645 A1     Aug. 1, 2024

(51) Int. Cl.
| | |
|---|---|
| *C25D 3/38* | (2006.01) |
| *C25D 5/02* | (2006.01) |
| *C25D 5/10* | (2006.01) |
| *C25D 5/34* | (2006.01) |
| *C25D 7/12* | (2006.01) |
| *H10P 90/00* | (2026.01) |
| *H10W 20/00* | (2026.01) |

(52) U.S. Cl.
CPC ................. *C25D 3/38* (2013.01); *C25D 5/02* (2013.01); *C25D 5/10* (2013.01); *C25D 5/34* (2013.01); *C25D 7/12* (2013.01); *H10P 90/00* (2026.01); *H10W 20/057* (2026.01)

(58) Field of Classification Search
None
See application file for complete search history.

(56) References Cited

U.S. PATENT DOCUMENTS

| | | |
|---|---|---|
| 2022/0018036 A1 | 1/2022 | Banik, II et al. |
| 2022/0084951 A1 | 3/2022 | Tu et al. |
| 2022/0282389 A1 | 9/2022 | Chen et al. |
| 2022/0285303 A1 | 9/2022 | Mirkarimi et al. |

FOREIGN PATENT DOCUMENTS

WO     WO-2021236398 A1 * 11/2021    ....... H01L 23/53228

OTHER PUBLICATIONS

International Search Report and Written Opinion received May 20, 2024, issued in corresponding International Application No. PCT/US2024/012360, filed Jan. 22, 2024, 11 pages.
International Preliminary Report on Patentability mailed Aug. 7, 2025, issued in corresponding International Application No. PCT/US2024/012360, filed Jan. 22, 2024, 7 pages.

* cited by examiner

*Primary Examiner* — Daniel J. Schleis
(74) *Attorney, Agent, or Firm* — CHRISTENSEN O'CONNOR JOHNSON KINDNESS PLLC

(57) ABSTRACT

A semiconductor wafer, including a substrate, at least one via formed in the substrate, and copper electroplating inside the at least one via, where the copper electroplating comprises a first layer of nanotwin copper, and a second layer of bulk copper. Further, a method of making a semiconductor wafer, the method comprising providing a substrate; etching the substrate to form at least one via; and depositing copper electroplating inside the at least one via, wherein the copper electroplating comprises a first layer of nanotwin copper, and a second layer of bulk copper.

17 Claims, 8 Drawing Sheets

14

LOW TEMPERATURE HYBRID BONDING METALLIZATION

BACKGROUND

In today's cost-efficient, fan-out wafer level processing, copper redistribution lines (RDL), especially multiple layer RDL, play a critical role in enhancing the electric bandwidth between chips. However, cracks in RDL caused by high temperature annealing and the coefficient of thermal expansion (CTE) mismatch can occur. Therefore, copper with high mechanical properties and high thermal stability is in demand. The same is true in the hybrid-bonding field. Copper-copper bonding has advantages compared to other bonding approaches for die and wafer level attachment. Such bonding currently requires high temperature and pressure, as well as attention to surface preparation and cleanliness. The distinctive mechanical properties, higher diffusivity coefficient, resistance to oxidation, and increased resistance to electromigration makes nanotwin-orientated and fine grain copper the ideal choices for RDL, hybrid bonding, and copper pillar applications in semiconductor industry.

Nanotwin copper (NTCu) has attracted worldwide attention ever since its first introduction in 2004. In the past 15 to 20 years, a large number of researchers from worldwide research institutes/commercial companies have tried to synthesize NTCu with high efficiency to be applied in semiconductor industry. Despite the vast interest/effort, the commercial production of the high efficiency NTCu is still not possible.

For RDL applications, sidewall seeding disrupts columnar structure. Though several chemical vendors offer materials that support the growth of columnar NTCu grains, and NTCu can be used for pillar or RDL formation plating through resists, the sidewall seed disruption makes high efficiency NTCu a great challenge in synthesis. In addition to the sidewall seed disruption, NTCu is not effective for small damascene features. The current conformal plating nature of the current NtCu plating chemistry can easily cause void issues within the damascene feature, especially when the damascene feature has a high aspect ratio. Current research has demonstrated good NTCu growth in blanket Cu fill or low aspect ratio vias, but the challenge for the modern high aspect ratio vias/trenches remains unresolved.

When considering the challenges in semiconductor RDL, damascene structures, or hybrid bonding, one major problem with NTCu is that sidewall seeding disrupts the columnar structure. This effect is especially obvious when the aspect ratio is larger than 1. For example, in some instances the NTCu percentage on the via interface for hybrid bonding has to be reduced from 80-90% for an aspect ratio of 0.2 to 0% for an aspect ratio of 1. Across industry, there has been extensive research on the routes to tackle this challenging problem. For example, chemical vendors are striving to produce new additives to suppress the sidewall growth while keeping the twining structure. Different processes including plating waveform optimization and alternative integration design methods are developed to receive high percentage NTCu on the hybrid bonding interface. However, most of those works are under development and there is no satisfactory solution developed yet.

Unlike NTCu, fine grain Cu can fill an RDL or damascene via with less sidewall interruption in orientation growth concern. Further, fine grain Cu can offer similar advantages in reduced thermal expansion energy requirements in hybrid bonding due to its grain growth. Therefore, fine grain Cu has received more interest as a candidate for low temperature hybrid bonding materials. However, it has its own challenges, i.e., impurity control and stability. To keep the fine grain, a relatively large amount of additive organics are co-deposited into the Cu which can affect the electronic properties of the final product. Some fine grain copper chemistry demonstrates fine grain stability issues. Post plating, the wafer will go through several steps before the bonding and if the grain grows during the queue time, the advantage of the fine grain Cu in hybrid bonding lessens as additional time and expense is needed.

Further, conventionally, a major problem in filling small damascene features is the mass transfer rate which can be improved by agitation, bulk solution concentration, and temperature. For instance, the mass transfer in the bottom of the damascene feature is different from that on the top of the feature.

Accordingly, low temperature hybrid bonding materials are still needed. Further, methods and materials capable of filling small damascene features are still needed.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Disclosed herein is a design and controllable synthesis of Cu with different grain structures for low temperature hybrid bonding applications.

In one aspect, a semiconductor wafer is disclosed, including a substrate, at least one via formed in the substrate, and a copper electroplating inside the at least one via, where the copper electroplating includes a first layer of nanotwin copper, and a second layer of bulk copper.

In some embodiments, the bulk copper is fine grain copper. In some embodiments, the first layer is deposited in the via before the second layer is deposited in the via. In some embodiments, the first layer extends above a top of the via. In some embodiments, the second layer is deposited in the via before the first layer is deposited in the via. In some embodiments, the second layer extends above a top of the via. In some embodiments, the second layer partially fills the via and the first layer partially fills the via and extends above the top of the via. In some embodiments, the via is a double via, comprising a first and a second via. In some embodiments, the via is a triple via, comprising a first via, a second via, and a third via. In some embodiments, the second layer fills the first via and partially fills the second via, while the first layer partially fills the second via and extends above a top of the second via. In some embodiments, the second layer fills the first via and the second via, and partially fills the third via, while the second layer partially fills the third via and extends above a top of the third via.

In some embodiments, the first layer of nanotwin copper provides a hybrid bonding interface. In some embodiments, the hybrid bonding interface includes above 50% nanotwin copper. In some embodiments, the hybrid bonding interface is 0-100% nanotwin copper. In some embodiments, the copper electroplating further includes one or more organic additives.

In some embodiments, the aspect ratio of the at least one via and the substrate is about 0.1.

In another aspect, a method of making a semiconductor wafer includes providing a substrate, etching the substrate to form at least one via, depositing a first layer of nanotwin copper inside the at least one via, and depositing a second layer of bulk copper inside the at least one via.

In some embodiments, the first layer of nanotwin copper is deposited before the second layer of bulk copper. In some embodiments, the first layer of nanotwin copper extends above a top of the via. In some embodiments, the second layer of bulk copper is deposited before the first layer of nanotwin copper. In some embodiments, the second layer of bulk copper extends above a top of the via.

In some embodiments, depositing the copper stack may further include an intermediate cleaning step. In some embodiments, the bulk copper is cleaned with an acid. In some embodiments, the bulk copper is cleaned with an acid and an oxidizing agent.

In some embodiments, the second layer of bulk copper is fine grain copper.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1A:
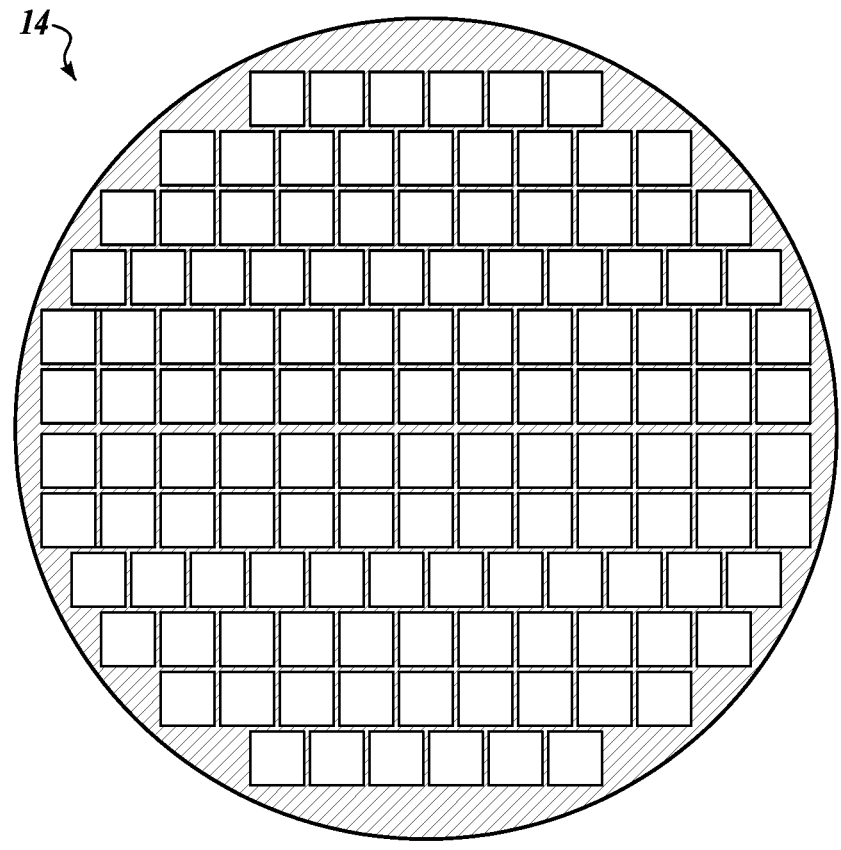
FIG. 1A is a conventional wafer, in accordance with conventional technology.

While illustrative embodiments have been illustrated and described, it will be appreciated that various changes can be made therein without departing from the spirit and scope of the invention.

It is not the inventor's intention to limit this technology only to semiconductor applications listed here. The disclosed technology herein has many potential applications where similar research challenges are involved. Depending on the feature structure, the disclosed technology can design controllable Cu or Cu alloys with different grain structure synthesis processes to be suitable with low temperature hybrid bonding.

Before explaining at least one embodiment of the presently disclosed and/or claimed inventive concept(s) in detail, it is to be understood that the presently disclosed and/or claimed inventive concept(s) is not limited in its application to the details of construction and the arrangement of the components or steps or methodologies set forth in the following description. The presently disclosed and/or claimed inventive concept(s) is capable of other embodiments or of being practiced or carried out in various ways. Also, it is to be understood that the phraseology and terminology employed herein is for the purpose of description and should not be regarded as limiting.

Unless otherwise defined herein, technical terms used in connection with the presently disclosed and/or claimed inventive concept(s) shall have the meanings that are commonly understood by those of ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the presently disclosed and/or claimed inventive concept(s) pertains. All patents, published patent applications, and non-patent publications referenced in any portion of this application are herein expressly incorporated by reference in their entirety to the same extent as if each individual patent or publication was specifically and individually indicated to be incorporated by reference.

All of the articles and/or methods disclosed herein can be made and executed without undue experimentation in light of the present disclosure. While the articles and methods of the presently disclosed and/or claimed inventive concept(s) have been described in terms of preferred embodiments, it will be apparent to those skilled in the art that variations may be applied to the articles and/or methods and in the steps or in the sequence of steps of the method described herein without departing from the concept, spirit, and scope of the presently disclosed and/or claimed inventive concept(s).

As utilized in accordance with the present disclosure, the following terms, unless otherwise indicated, shall be understood to have the following meanings.

The use of the word "a" or "an" when used in conjunction with the term "comprising" may mean "one", but it is also consistent with the meaning of "one or more", "at least one", and "one or more than one". The use of the term "or" is used to mean "and/or" unless explicitly indicated to refer to alternatives only if the alternatives are mutually exclusive, although the disclosure supports a definition that refers to only alternatives "and/or". Throughout this application, the term "about" is used to indicate that a value includes the inherent variation of error for the quantifying device, the method being employed to determine the value, or the variation that exists among the study subjects. For example, but not by way of limitation, when the term "about" is utilized, the designation value may vary by plus or minus twelve percent, or eleven percent, or ten percent, or nine percent, or eight percent, or seven percent, or six percent, or five percent, or four percent, or three percent, or two percent, or one percent. The use of the term "at least one" will be understood to include one as well as any quantity more than one, including but not limited to, 2, 3, 4, 5, 10, 15, 20, 30, 40, 50, 100, etc. The term "at least one" may extend up to 100 or 1000 or more, depending on the term to which it is attached; in addition, the quantities of 100/1000 are not to be considered limiting, as lower or higher limits may also produce satisfactory results. In addition, the use of the term "at least one of X, Y, and Z" will be understood to include X alone, Y alone, and Z alone, as well as any combination of X, Y, and Z. The use of ordinal number terminology (i.e., "first", "second", "third", "fourth", etc.) is solely for the purpose of differentiating between two or more items and is not meant to imply any sequence or order or importance to one item over another or any order of addition, for example.

As used herein, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. The term "or combinations thereof" as used herein refers to all permutations and combinations of the listed items preceding the term. For example, "A, B, C, or combinations thereof" is intended to include at least one of: A, B, C, AB, AC, BC, or ABC and, if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Figure 1B:
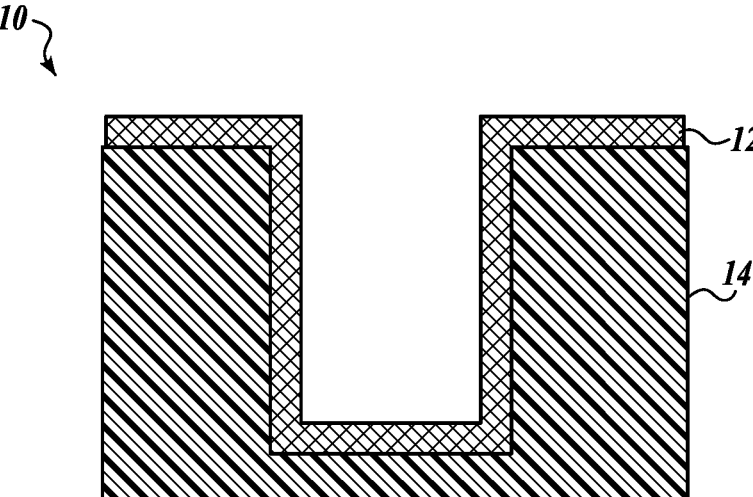
FIGS. 1B-1C are conventional vias, in accordance with conventional technology.
Figure 1C:
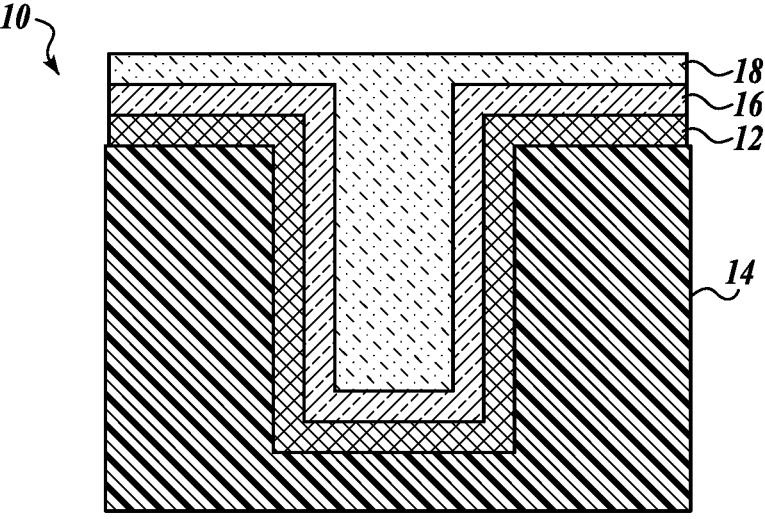

Turning now to the Figures, FIG. 1A shows a wafer 14, in accordance with conventional technology. Wafer 14 may be made of silicon or another semiconductor material, and is designed in the form of a thin disc. In some applications, wafer 14 can be used to create electronic integrated circuits (ICs). In such applications, wafer 14 is considered a substrate, such as shown in FIGS. 1B-1C. In some embodiments, wafer 14 includes one or more vias, as described herein.

FIGS. 1B and 1C show vias 10, in accordance with conventional technology. In some embodiments, wafer 14 (also referred to herein as substrate 14) includes one or more vias 10. In some embodiments, via 10 may be a copper interconnect.

As a non-limiting example, the series of layers in a via 10 typically include a dielectric layer in the form of a substrate 14, and a barrier layer 12 (see FIG. 1B). In some embodiments, via 10 includes a seed layer 16 (see FIG. 1C), and a copper fill 18. In some embodiments, via 10 may also include a copper cap, not shown in FIGS. 1B and 1C.

The conventional fabrication of via 10 may include a suitable deposition of a barrier layer 12 on the substrate 14 to prevent the diffusion of copper 18 into the dielectric material of the substrate 14. Suitable barrier layers 12 include, for example, titanium (Ti), tantalum (Ta), titanium nitride (TiN), tantalum nitride (TaN), etc. In some embodiments, the barrier layer 12 may be Mn-based, such as manganese (Mn) and manganese nitride (MnN).

In some embodiments, a seed layer 16 may be deposited on the barrier layer 12. In the case of depositing copper in a feature, there are several exemplary options for the seed layer 16. First, seed layer 16 may be a copper seed layer that is deposited using a Physical Vapor Deposition (PVD) technique. As another non-limiting example, the seed layer 16 may be a copper alloy, such as copper manganese, copper cobalt, or copper nickel alloys. The seed layer 16 may also be formed by using other deposition techniques, such as Chemical Vapor Deposition (CVD) or Atomic Layer Deposition (ALD).

Second, the seed layer 16 may be a stack film, for example, a liner layer and a PVD seed layer (not shown in FIGS. 1B-1C). A liner layer is a material used in between a barrier and a PVD seed layer to mitigate discontinuous seed issues and improve adhesion of the PVD seed. Liners are typically noble metals such as ruthenium (Ru), platinum (Pt), palladium (Pd), and osmium (Os), but the list may also include cobalt (Co) and nickel (Ni). Currently, CVD Ru and CVD Co are common liners; however, liner layers may also be formed by using other deposition techniques, such as ALD or PVD.

Third, the seed layer 16 may be a secondary seed layer. A secondary seed layer is similar to a liner layer because it is typically formed from noble metals such as Ru, Pt, Pd, and Os, but the list may also include Co and Ni, and most commonly CVD Ru and CVD Co. (Like seed and liner layers, secondary seed layers may also be formed by using other deposition techniques, such as ALD or PVD.) The difference is the secondary seed layer serves as the seed layer, whereas the liner layer is an intermediate layer between the barrier layer and the PVD Cu seed.

After a seed layer 16 has been deposited according to one of the examples described above, the via may include a seed layer enhancement (SLE) layer, which is a thin layer of deposited metal (not shown in FIGS. 1B-1C). As a non-limiting example, an SLE layer may be a copper layer having a thickness of about 2 nm. An SLE layer is also known as an electrochemically deposited seed (or ECD seed), which may be a conformal deposited layer.

An ECD copper seed is typically deposited using an alkaline chemistry including a very dilute copper ethylenediamine (EDA) complex. ECD copper seed may also be deposited using other copper complexes, such as ethylenediamine, glycine, citrate, tartrate, ethylenediaminetetraacetic acid (EDTA), urea, etc., and may be deposited in a pH range of about 2 to about 11, about 3 to about 10, about 4 to about 10, or in a pH range of about 6 to about 10.

After the seed layer 16 has been deposited according to one of the examples described above (which may also include an optional ECD seed), conventional ECD fill (or copper fill) 18 and cap may be performed in the feature, for example, using acid plating chemistry at a pH of less than 1.0. Conventional ECD copper acid chemistry may include, for example, copper sulfate, sulfuric acid, methane sulfonic acid, hydrochloric acid, and organic additives (such as accelerators, suppressors, and levelers). The accelerator is used to enhance the plating rate inside the feature, the suppressor to suppress plating on the field, and the leveler to reduce the thickness variation of the plated copper over small dense features and wide ones. The combination of these additives enhances the bottom-up plating inside the feature relative to the plating on the field. Conventional ECD fill is typically bottom-up gap fill, super-fill, or super-conformal plating, having a goal of substantially void-free fill.

Electrochemical deposition of copper has been found to be a cost effective manner for depositing a copper metallization layer. In addition to being economically viable, ECD deposition techniques provide a substantially bottom up (e.g., nonconformal or super-conformal) metal fill mechanically and electrically suitable for interconnect structures. However, the metallization layer may also be deposited without electrochemical methods.

It should be understood that the disclosed technology described herein is capable of being integrated into a wafer, such as wafer 14 having one or more vias 10. For clarity, a barrier and/or seed layer is not illustrated in the following figures, but it should be understood that each could be included. Further, the vias disclosed herein may be at least partially manufactured by the processes described above.

In this disclosure, a bulk Cu and NTCu stack structure is described, designed to tackle the low NTCu percentage within high aspect ratio features, i.e., aspect ratios at or above 1. By growing a bulk Cu underlayer, the aspect ratio of features for NTCu growth is reduced. For example, a 1:1 aspect ratio feature can be reduced to 0.1. Correspondingly, the NTCu percentage on the hybrid bonding interface may increase from 0 percentage to over 50%. In some embodiments, the method further includes forming a hybrid bonding interface at a top of the via. In some embodiments, the hybrid bonding interface is above 50% nanotwin copper. In some embodiments, the hybrid bonding interface ranges from 0 to 100% nanotwin copper.

In order to achieve these results, disclosure herein is directed to a copper stack including bulk Cu with a flat surface within a feature to create a repeatable, lowered aspect ratio for NTCu growth.

Figure 2A:
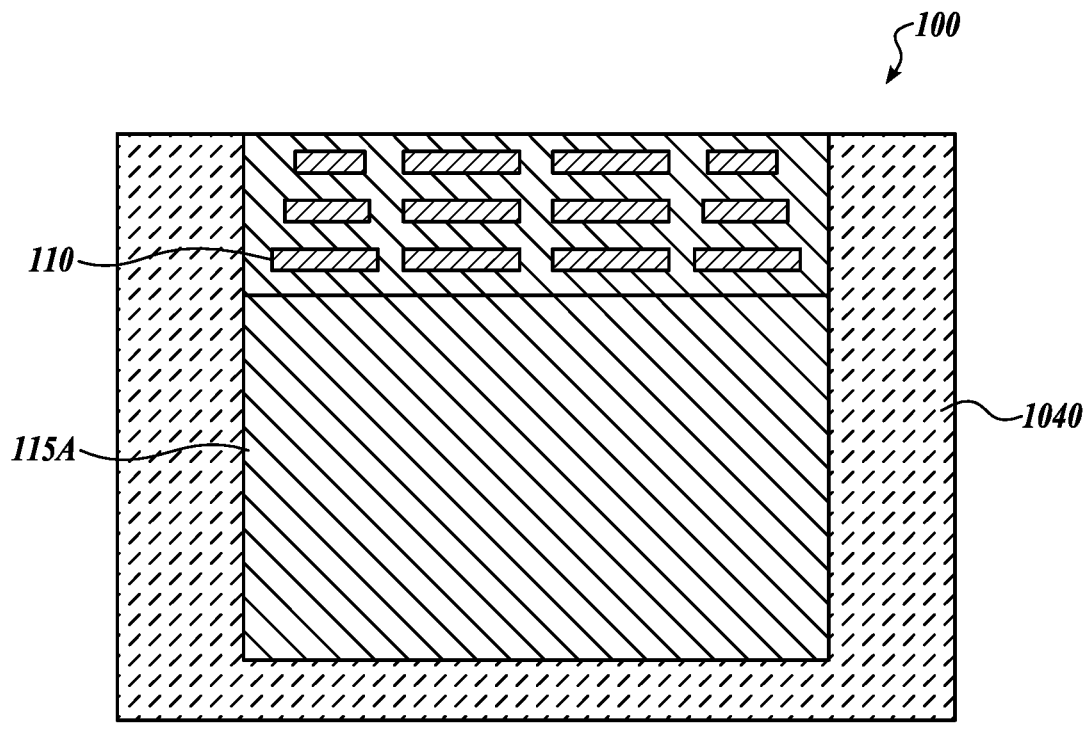
FIGS. 2A-2B are example copper stacks, including a layer of bulk copper and a layer of nanotwin copper, in accordance with the present technology.
Figure 2B:
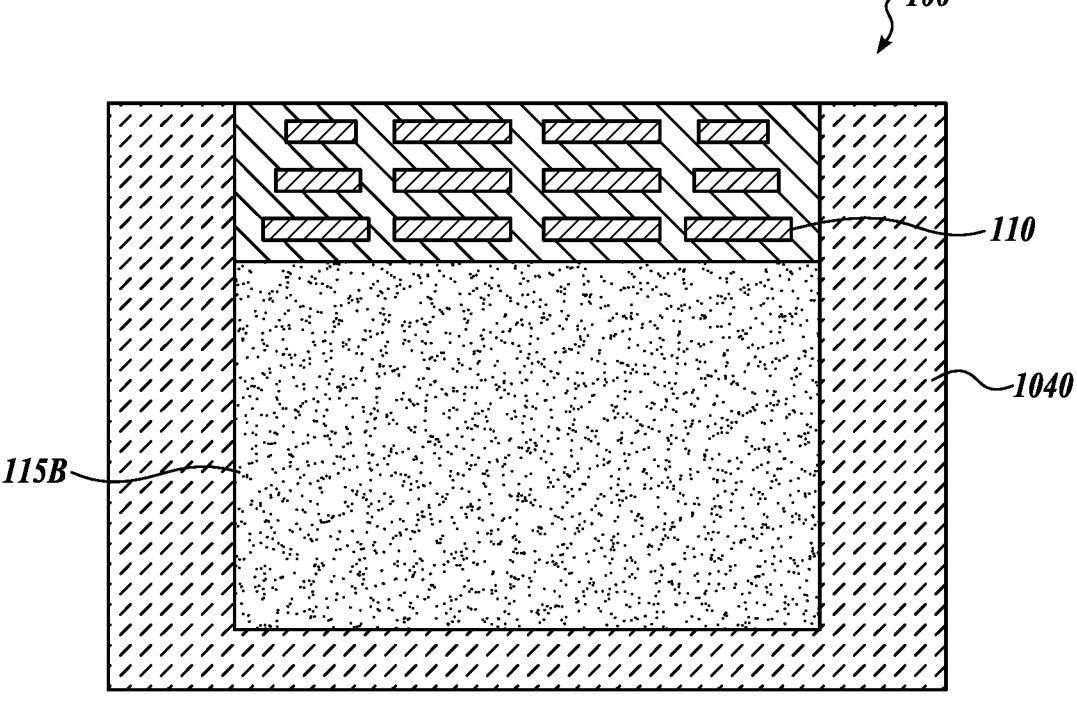

FIGS. 2A and 2B are example copper stacks 100, including a layer of bulk copper 115A and a layer of nanotwin copper 110, in accordance with the present technology. In some embodiments, the copper stack 100 is deposited inside of a via in a substrate (such as via 10 in substrate 14). In some embodiments, the copper stack 100 may be deposited into a small damascene feature.

In some embodiments, copper stack 100 includes both bulk copper 115A and nanotwin copper 110. In some embodiments, copper stack 100 includes one or more organic additives. FIG. 2A shows a copper stack 100 having a first layer of NTCu 110 and a second layer of bulk copper 115A. As shown in FIG. 2A, the bulk copper 115A may have a "normal grain" size, i.e., a grain size of over 100 nm.

In some embodiments, the second layer of bulk copper 115A is deposited into the via before the first layer of NTCu 110. The resulting copper stack can maintain the high aspect ratio because of the first layer of NTCu 110 but because the bulk copper 115A fills the via, interruption of the side wall based on the potential growth of the NTCu can be reduced.

In some embodiments, such as shown in FIG. 2B, the layer of bulk copper 115 is fine grain bulk copper 115B. Unlike NTCu 110, fine grain Cu 115B can fill the RDL or damascene via with less sidewall interruption in orientation growth concerns. It can also offer similar advantages in the form of a reduced thermal expansion energy requirement in hybrid bonding due to its grain growth. Because of these advantages, fine grain Cu can be used for metallization in low temperatures.

Figure 2C:
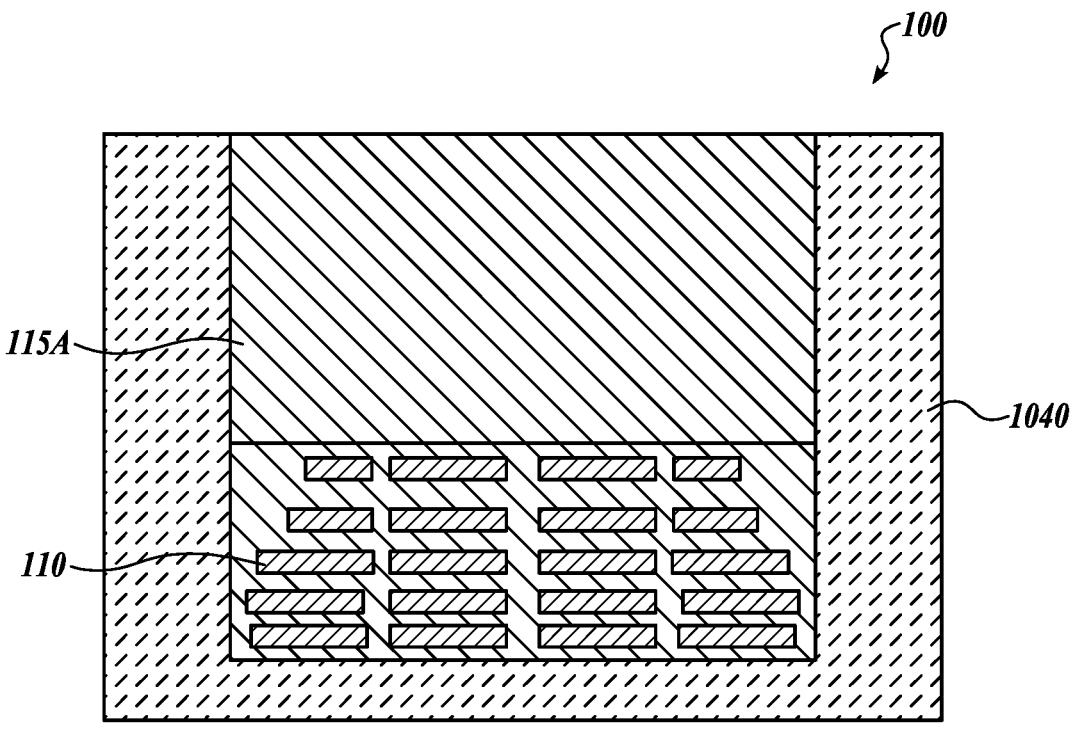
FIGS. 2C-2D are example copper stacks, including a layer of nanotwin copper, and a layer of bulk copper, in accordance with the present technology.
Figure 2D:
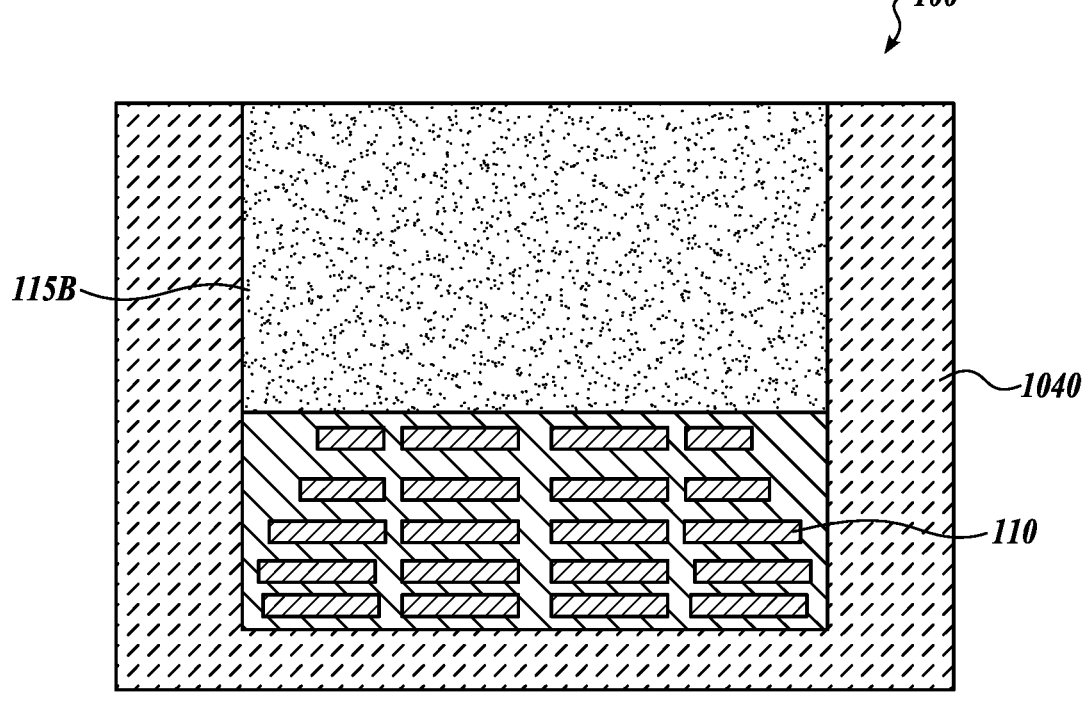

FIGS. 2C and 2D are example copper stacks 100, including a layer of nanotwin copper 110, and a layer of bulk copper 115, in accordance with the present technology.

In some embodiments, the copper stack 100 includes both nanotwin copper 110 and bulk copper 115A. In some embodiments, the first layer of NTCu 110 is deposited into the via before the second layer of bulk copper 115A. As shown in FIG. 2C, the bulk copper 115A may have a grain size of more than 100 nm.

In some embodiments, the bulk copper 115 is fine grain bulk copper 115B. In some embodiments, the fine grain bulk copper 115B can fill gaps in small damascene features as described herein. The grain size of the bulk Cu chemistry may also influence the final low temperature hybrid bonding evaluation. Grain structure in polycrystalline material can dominate material properties and because of this fine grain Cu provides additional benefits in low temperature hybrid bonding.

Figure 3A:
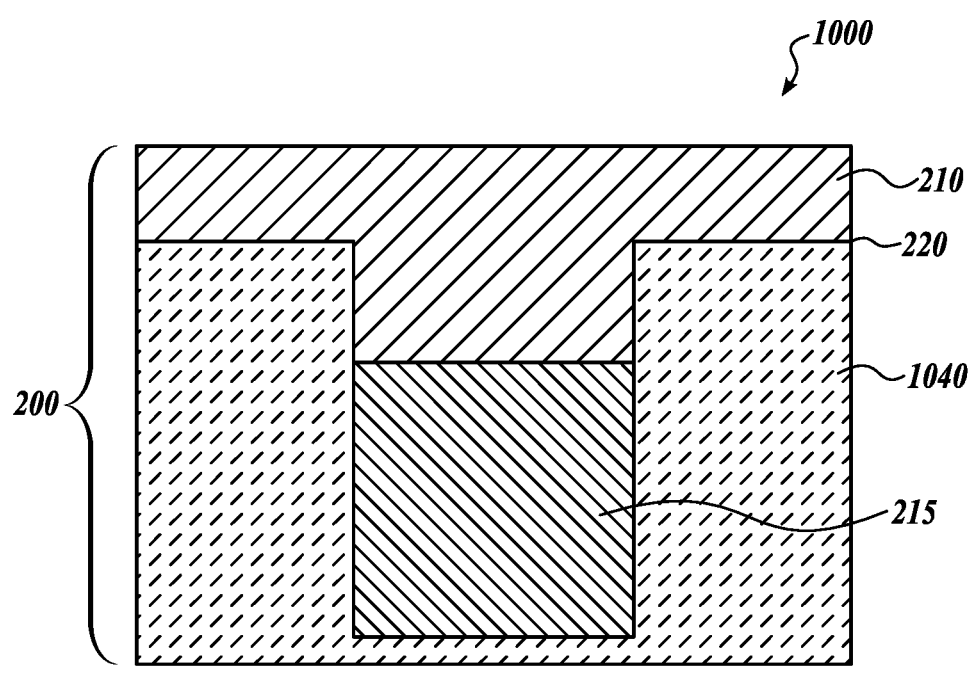
FIG. 3A is an example via filled with an example copper stack having a first layer and a second layer, in accordance with the present technology.

FIG. 3A is an example via 1000 filled with an example copper stack 200 having a first layer 210 and a second layer 215, in accordance with the present technology. In some embodiments, the second layer 210 partially fills the via 1000, while the first layer 215 partially fills the via 1000 and extends past a top 220 of the via 1000.

In some embodiments, the first layer 210 and the second layer 215 may be copper, as discussed in FIGS. 2A-2D. In some embodiments, the first layer 210 is fine grain copper. In some embodiments, the first layer 210 is NTCu. In some embodiments, the second 215 is fine grain copper. In some embodiments, the second layer 215 is NTCu. Further, in some embodiments, both the first layer 210 and the second layer 215 are fine grain copper.

Figure 3B:
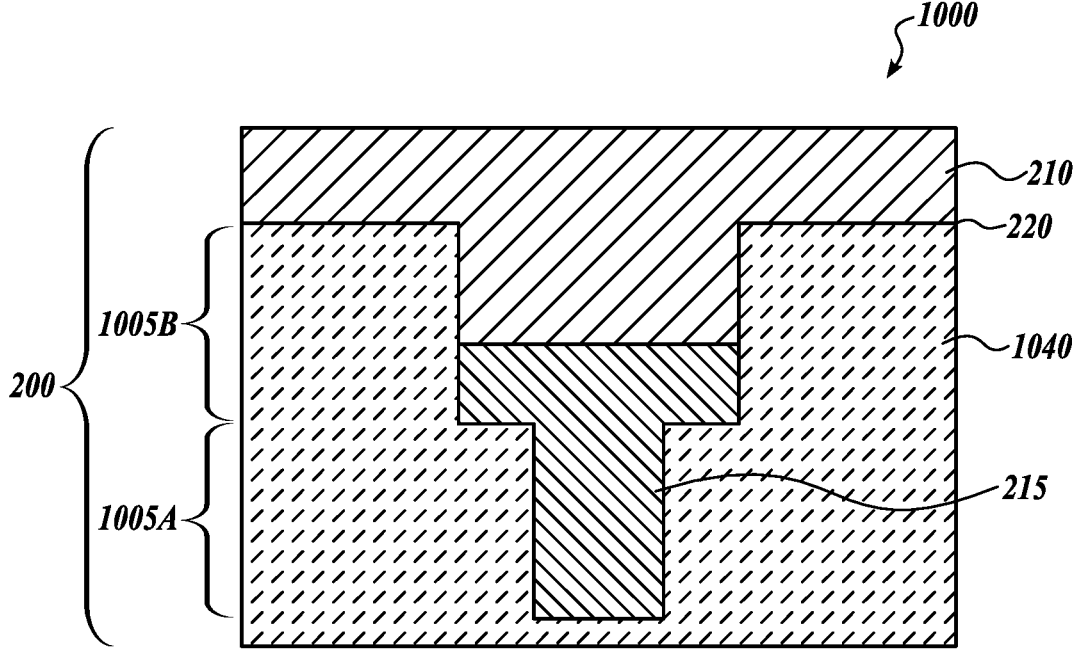
FIG. 3B is an example double via filled with an example copper stack having a first layer and a second layer where the first layer extends past a second via, in accordance with the present technology.

FIG. 3B is an example double via 1000 filled with an example copper stack 200 having a first layer 210 and a second layer 215 where the first layer 215 extends past a second via 1005B, in accordance with the present technology. In some embodiments, the via 1000 is a double via 1000. In some embodiments, the double via 1000 includes a first via 1005A and a second via 1005B. In some embodiments, the second layer 215 fills the first via 1005A and partially fills the second via 1005B, while the first layer 210 partially fills the second via 1005B and extends above a top 220 of the second via 1005B. In some embodiments, the first via 1005A has a width smaller than a width of the second via 1005B. In some embodiments, a depth of the first via 1005A a depth that is substantially similar to that of the second via 1005B.

Figure 3C:
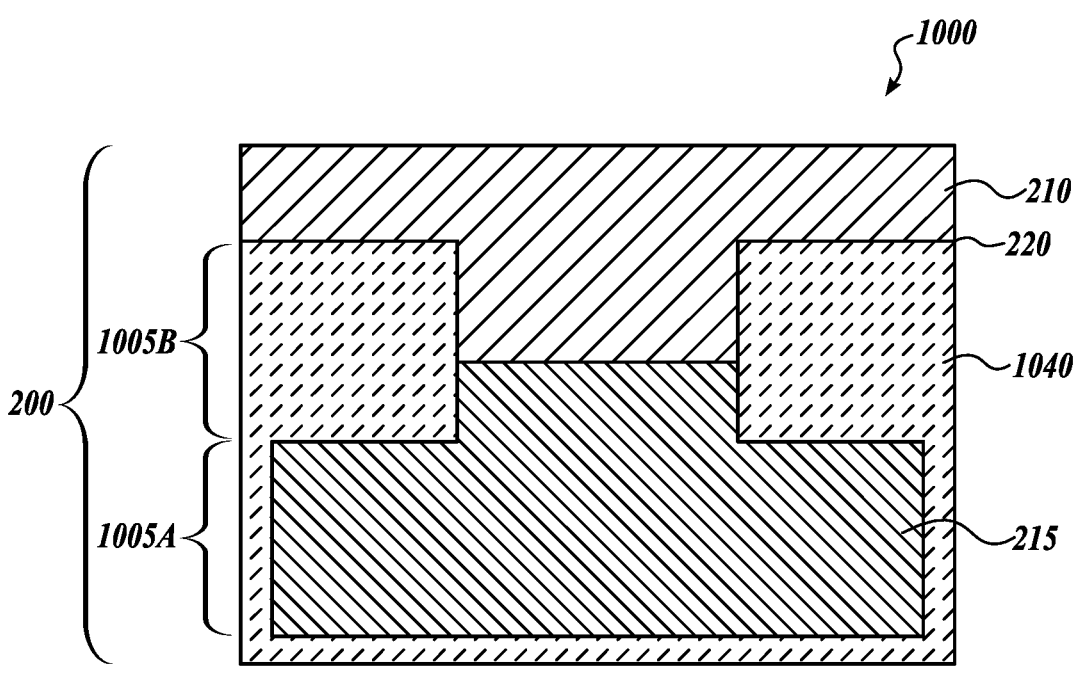
FIG. 3C is an example double via filled with an example copper stack having a first layer and a second layer where the first layer extends past a second via, in accordance with the present technology.

FIG. 3C is an example double via 1000 filled with an example copper stack 200 having a first layer 210 and a second layer 215 where the first layer 210 extends past a second via 1005B, in accordance with the present technology. In some embodiments, a width of the first via 1005A is greater than a width of the second via 1005B.

Figure 3D:
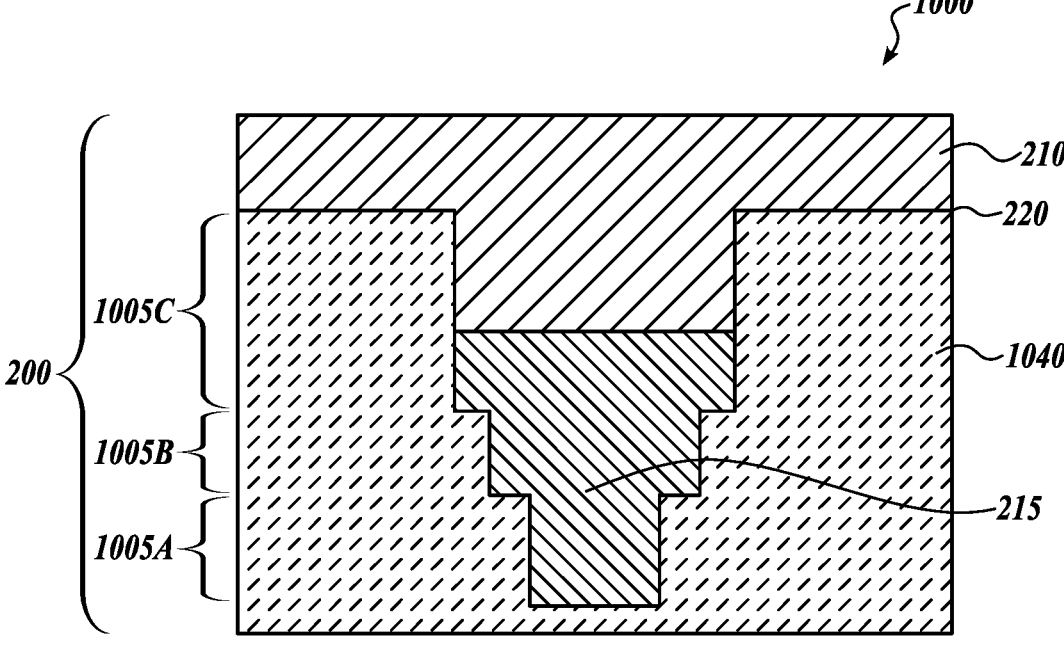
FIG. 3D is an example triple via filled with an example copper stack having a first layer and a second layer where the first layer extends past a third via, in accordance with the present technology.

FIG. 3D is an example triple via 1000 filled with an example copper stack 200 having a first layer 210 and a second layer 215 where the first layer 210 extends past a third via 1005C, in accordance with the present technology. In some embodiments, the via 1000 is a triple via 1000, including a first via 1005A, a second via 1005B, and a third via 1005C. In some embodiments, the second layer 215 fills the first via 1005A and the second via 1005B, and partially fills the third via 1005C, while the first layer 210 partially fills the third via 1005C and extends above a top 220 of the third via 1005C. In some embodiments, a width of the first via 1005A is smaller than a width of the second via 1005B. In some embodiments, a width of the third via 1005C is greater than the width of the first via 1005A and the second via 1005B. In some embodiments, a depth of the first via 1005A and the second via 1005B in combination may be substantially equal to a depth of the third via 1005C.

Figure 3E:
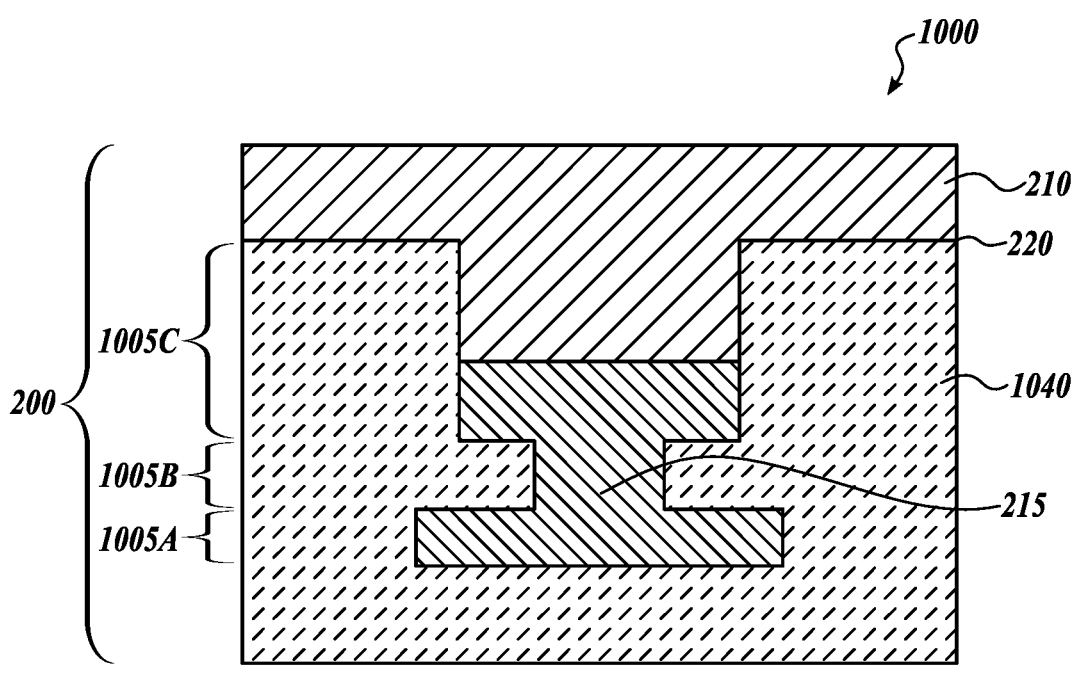
FIG. 3E is an example triple via filled with an example copper stack having a first layer and a second layer where the first layer extends past a third via, in accordance with the present technology.

FIG. 3E is an example triple via 1000 filled with an example copper stack 200 having a first layer 210 and a second layer 215 where the first layer 210 extends past a third via 1005C, in accordance with the present technology. In some embodiments, a width of the first via 1005A is larger than a width of the second via 1005B, the third via 1005C, or both the second via 1005B and the third via 1005C.

Figure 3F:
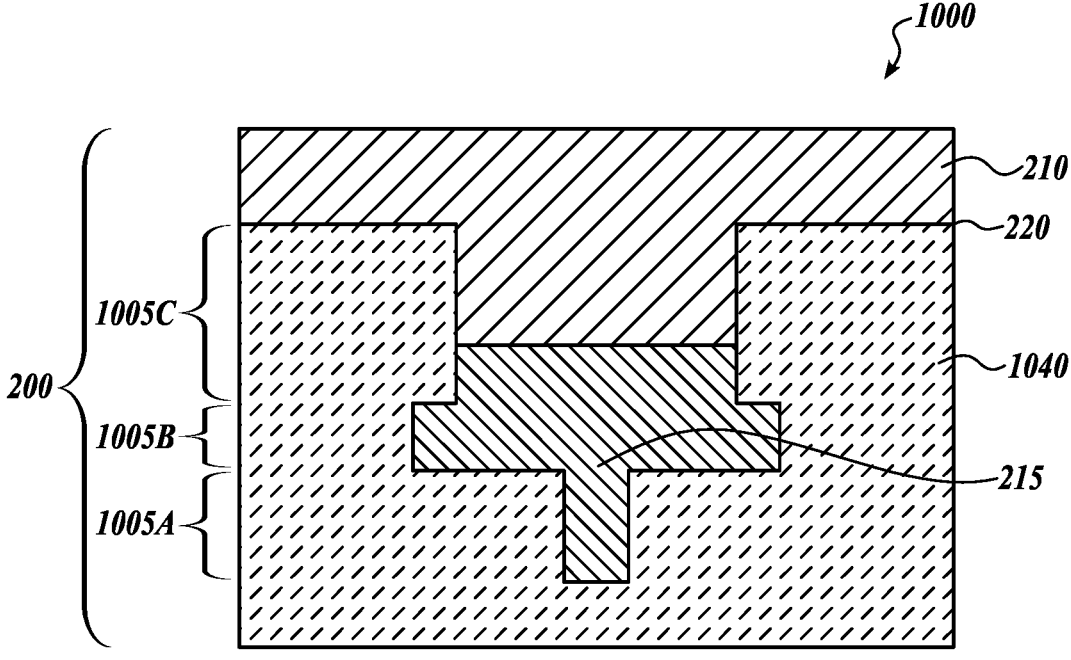
FIG. 3F is an example triple via filled with an example copper stack having a first layer and a second layer where the first layer extends past a third via, in accordance with the present technology.

FIG. 3F is an example triple via 1000 filled with an example copper stack 200 having a first layer 210 and a second layer 215 where the first layer 210 extends past a third via 1005C, in accordance with the present technology. In some embodiments, a width of the second via 1005B is greater than a width of the first via 1005A, the third via 1005B, or both the first via 1005A and the third via 1005C.

Figure 4:
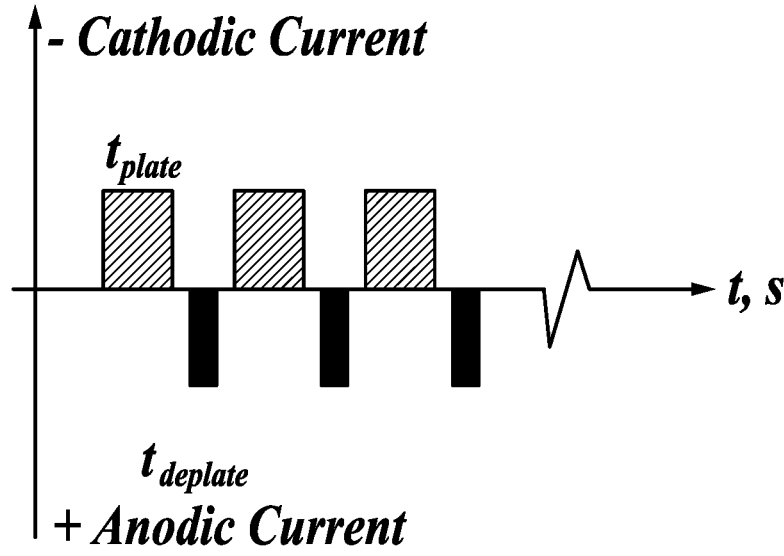
FIG. 4 is a graph representing a plurality of pulses applied to the semiconductor described herein during electroplating, in accordance with the present technology.

FIG. 4 is a graph representing an example plating technique, including a plurality of pulses applied to the semiconductor described herein during electroplating, in accordance with the present technology. A waveform plating process was developed to get fine grain Cu with similar or better purity Cu compared to the industry applicable Cu and good stability with a queue time of at least one month. In some embodiments, a copper stack (such as copper stack 100 in FIGS. 2A-2D) is plated (i.e., deposited) with pulse plating. In some embodiments, the copper stack is plated with a combination of pulse and pulse-reverse plating. In some embodiments, not illustrated in FIG. 4, the copper stack is plated with direct current (DC) plating. In some embodiments, the copper stack is plated with waveform plating. Any form of plating that allows for the copper stack to be plated should be appreciated as a potential method for plating the copper stack.

Unlike DC plating, pulse/pulse reverse plating waveform occurs with a high peak current and on time (i.e., the time that the plurality of pulses is applied). In some embodiments, pulse/pulse reverse plating also includes off time (i.e., the time that the plurality of pulses is not applied). Pulsed electroplating increases the density of nucleation sites with a high current density during the on time while interrupting growth and favoring re-nucleation during off time which facilitates the grain size control. Regarding the sidewall seeding disruptions of the columnar structure, a reverse waveform can effectively and partially remove the copper sidewall growth. In some embodiments, using multiple sequential waveforms can better control the grain growth stress.

In electroplating, due to the current distribution, the edges and side walls are preferentially growing. In contrast, in the reverse process, the edges and side walls will be preferentially removed. Therefore, in the pulse reverse plating, the side wall disruption can be effectively eliminated. In some embodiments the reverse process on and off time can also be adjusted/controlled to not adversely affect the fine grain Cu growth. In some embodiments, multiple/sequential pulse/pulse reverse plating is used because it allows for fine adjustment of the nucleation and growth under different mass transfer rates. When the damascene feature has a small or high aspect ratio, the bottom mass transfer is mainly diffusion controlled and the required plating conditions are different when the grain growth is on the top of the feature and where convection plays a role in mass transfer. Therefore, in some embodiments, the plating waveform is adjusted to facilitate the fine grain Cu growth in small damascene features.

In some embodiments, the pulse/pulse reverse electroplating facilitates NTCu growth in small damascene features. The pulse electroplating allows for synthesis of the nanotwin structures, while the reverse pulse electroplating prevents the NTCu from disrupting the side wall and/or the columnar structure.

Another advantage of the use of the pulse electroplating described herein is the ability to control synthesis. As explained herein, in some embodiments, the plurality of pulses include an on and off time. The switching of the on and off time makes the grain growth stress transfer/enhancement possible. By properly controlling the pulse electroplating frequency and duty cycle, the grain growth stress can be controlled to be compressive-dominated or tensile-dominated. This precise stress control and mass transfer control makes the single/sequential pulse/pulse reverse plating a good choice in handling the complex geometric and structural requirements for semiconductor applications.

FIG. 4 shows an example waveform made of pulses that can be applied to achieve the advantages described herein. The vertical axis represents the charge density of each pulse. At the top of the vertical axis is negative, cathodic current. At the bottom of the vertical axis is positive, anodic current. The horizontal axis represents the time in seconds and demarcates a state of uncharged current. Accordingly, when each pulse, represented as a bar in FIG. 4, is above the horizontal axis, it represents a cathodic pulse, and when each pulse is below the horizontal axis, it represents an anodic pulse.

Further, as described herein, each cathodic pulse, when applied, represents a period of time where the copper stack is being plated ($t_{plate}$), i.e., where the copper stack is growing. Additionally, each anodic pulse represents a period of time where the copper stack is being de-plated ($t_{deplate}$) i.e., where the copper stack growth in the seed wall is removed.

As shown in FIG. 4, there is one axis break in the horizontal axis. It should be understood that the axis break may represent an amount of time proportionally longer than the illustrated time in seconds.

It should be understood that the copper stack may also be plated with direct current (DC) plating. While not illustrated, any manner of DC plating may be utilized to plate the copper stacks.

Figure 5:
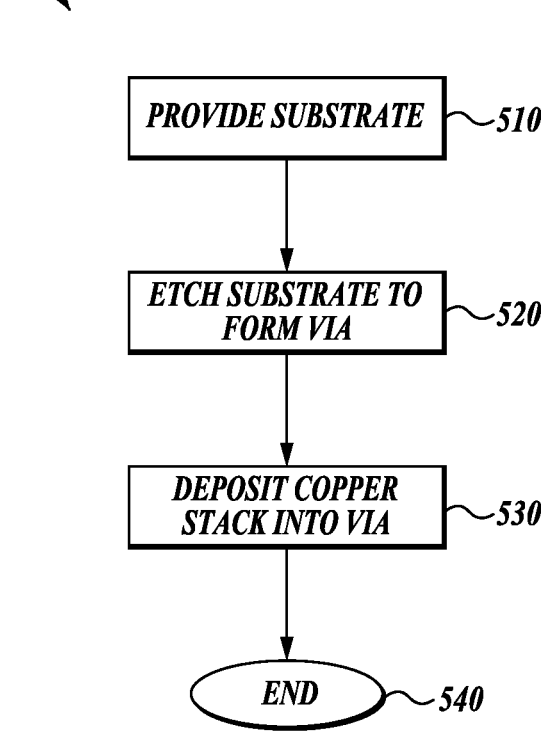
FIG. 5 is an example method of plating, in accordance with the present technology.

FIG. 5 is an example method 500 of plating, in accordance with the present technology. The method 500 begins in block 510.

In block 510, a substrate is provided. In some embodiments, the substrate is a wafer, such as wafer 14 in FIG. 1A. In some embodiments, the substrate is a dielectric material, such as silicon.

In block 520, the substrate is etched to form a via. In some embodiments, a plurality of vias may be etched. In some embodiments, the via may be a blind via, a buried via, or a through via.

In block 530, a copper stack (such as copper stack 100 or 200 as described herein) is deposited into the via. In some embodiments, the copper stack is deposited into the via through electroplating as described herein. In some embodiments, the copper stack has a first layer and a second layer. In some embodiments, the first layer is NTCu and the second layer is bulk copper. In some embodiments, the bulk copper is fine grain bulk copper. In some embodiments, the first layer is deposited before the second layer. In some embodiments, the second layer is deposited before the first layer. In some embodiments, depositing the copper stack may include DC plating or electroplating the copper stack with a plurality of pulses, as described herein. In some embodiments, depositing the copper stack may further include an intermediate cleaning step. In some embodiments, the bulk copper is cleaned with an acid. In some embodiments, the bulk copper is cleaned with an acid and an oxidizing agent. In one example, after bulk copper is deposited into the via, it is cleaned with sulfuric acid and peroxide. This cleaning step may allow for better NTCU growth on top of the bulk copper layer.

The present application may reference quantities and numbers. Unless specifically stated, such quantities and numbers are not to be considered restrictive, but representative of the possible quantities or numbers associated with the present application. Also, in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Generally, the embodiments disclosed herein are non-limiting, and the inventors contemplate that other embodiments within the scope of this disclosure may include structures and functionalities from more than one specific embodiment shown in the figures and described in the specification.

In the foregoing description, specific details are set forth to provide a thorough understanding of exemplary embodiments of the present disclosure. It will be apparent to one skilled in the art, however, that the embodiments disclosed herein may be practiced without embodying all the specific details. In some instances, well-known process steps have not been described in detail in order not to unnecessarily obscure various aspects of the present disclosure. Further, it will be appreciated that embodiments of the present disclosure may employ any combination of features described herein.

The present application may include references to directions, such as "vertical," "horizontal," "front," "rear," "left," "right," "top," and "bottom," etc. These references, and other similar references in the present application, are intended to assist in helping describe and understand the particular embodiment (such as when the embodiment is positioned for use) and are not intended to limit the present disclosure to these directions or locations.

The present application may also reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value. The term "based upon" means "based at least partially upon."

The principles, representative embodiments, and modes of operation of the present disclosure have been described in the foregoing description. However, aspects of the present disclosure, which are intended to be protected, are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure as claimed.

While illustrative embodiments have been illustrated and described, it will be appreciated that various changes can be made therein without departing from the spirit and scope of the invention.

The embodiments of the invention in which an exclusive property or privilege is claimed are defined as follows:

1. A semiconductor wafer, comprising:
   a substrate;
   at least one via formed in the substrate; and
   a copper electroplating inside the at least one via, wherein the copper electroplating comprises a first layer of nanotwin copper, and a second layer of bulk copper, wherein the bulk copper is fine grain copper.

2. The semiconductor of claim 1, wherein the first layer is deposited in the at least one via before the second layer is deposited in the via.

3. The semiconductor of claim 2, wherein the first layer extends above a top of the at least one via.

4. The semiconductor of claim 1, wherein the second layer is deposited in the via before the first layer is deposited in the at least one via.

5. The semiconductor of claim 4, wherein the second layer extends above a top of the at least one via.

6. The semiconductor wafer of claim 4, wherein the first layer of nanotwin copper provides a hybrid bonding interface, wherein the hybrid bonding interface comprises above 50% nanotwin copper.

7. The semiconductor of claim 1, wherein the second layer partially fills the at least one via; and the first layer partially fills the at least one via and extends above a top of the at least one via.

8. The semiconductor wafer of claim 1, wherein an aspect ratio of the at least one via and the substrate is about 0.1.

9. A method of making a semiconductor wafer, the method comprising:
   providing a substrate;
   etching the substrate to form at least one via;
   depositing a first layer of nanotwin copper inside the at least one via; and
   depositing a second layer of bulk copper inside the at least one via, wherein the second layer of bulk copper is a fine grain copper.

10. The method of claim 9, wherein the first layer of nanotwin copper is deposited before depositing the second layer of bulk copper.

11. The method of claim 9, wherein the first layer of nanotwin copper extends above a top of the at least one via.

12. The method of claim 9, wherein the second layer of bulk copper is deposited before depositing the first layer of nanotwin copper.

13. The method of claim 12, wherein the second layer of bulk copper extends above a top of the at least one via.

14. The method of claim 12, wherein the method further comprises:
   forming a hybrid bonding interface between the first layer of nanotwin copper and the second layer of bulk copper.

15. The method of claim 14, wherein the hybrid bonding interface comprises above 50% nanotwin copper.

16. The method of claim 12, further comprising:

after depositing the second layer of bulk copper, cleaning the second layer of bulk copper by applying an acid before depositing the first layer of nanotwin copper.

17. The method of claim 16, wherein cleaning the second 5 layer of bulk copper further comprises applying an oxidizing agent.

\* \* \* \* \*